United States Patent
Schreier et al.

(10) Patent No.: US 9,733,306 B2
(45) Date of Patent: Aug. 15, 2017

(54) REMOTE EVALUATION TOOL (71) Applicant: ANALOG DEVICES GLOBAL, Hamilton (BM)

(72) Inventors: Richard E. Schreier, Toronto (CA); Alexander Newcombe, Toronto (CA); Ross Willett, Toronto (CA); Andre Straker, Mississauga (CA)

(73) Assignee: ANALOG DEVICES GLOBAL, Hamilton (BM)

(*) Notice: Subject to any disclaimer, the term of this patent is extended or adjusted under 35 U.S.C. 154(b) by 62 days.

(21) Appl. No.: 14/935,644

(22) Filed: Nov. 9, 2015

(65) Prior Publication Data
US 2017/0067962 A1    Mar. 9, 2017

Related U.S. Application Data (60) Provisional application No. 62/077,539, filed on Nov. 10, 2014.

(51) Int. Cl.
| | | |
|---|---|---|
| G06F 11/00 | (2006.01) | |
| G01R 31/28 | (2006.01) | |
| G01R 31/317 | (2006.01) | |
| G01R 31/3177 | (2006.01) | |
| H04L 29/08 | (2006.01) | |
| G06F 11/22 | (2006.01) | |

(52) U.S. Cl.
CPC ... G01R 31/31718 (2013.01); G01R 31/3177 (2013.01); G01R 31/31707 (2013.01); G01R 31/31724 (2013.01); G06F 11/2294 (2013.01); H04L 67/10 (2013.01)

(58) Field of Classification Search
CPC ........ G01R 31/31718; G01R 31/31707; G01R 31/31724; G01R 31/3177; H04L 17/10; H04L 67/25; H04L 67/06; G06F 2201/875; G06F 11/2294
USPC ..... 714/724, 741, 25, 37, 47.1, 46; 717/124, 717/127, 135; 702/178, 187, 183
See application file for complete search history.

(56) References Cited

U.S. PATENT DOCUMENTS

| | | | |
|---|---|---|---|
| 6,393,591 B1 | 5/2002 | Jenkins, IV et al. | |
| 6,708,327 B1 | 3/2004 | Aliphas | |
| 6,721,687 B2 | 4/2004 | Bartolome et al. | |
| 7,761,259 B1 | 7/2010 | Seymour | |
| 7,984,428 B1 | 7/2011 | Seymour | |
| 2008/0229149 A1* | 9/2008 | Penton | G06F 11/36 714/30 |
| 2012/0198279 A1* | 8/2012 | Schroeder | G06F 11/3672 714/32 |
| 2014/0372983 A1* | 12/2014 | Presley | G06F 11/368 717/124 |

OTHER PUBLICATIONS

ChipScope Pro Software and Cores, User Guide, UG029 (v.14.3), Oct. 16, 2012, Xilinx, 226 pages.

* cited by examiner

Primary Examiner — Christine Tu
(74) Attorney, Agent, or Firm — Patent Capital Group (57) ABSTRACT

Remote evaluation, e.g., web-based evaluation, lowers the evaluation barrier by allowing an engineer to gain experience with an integrated circuit (IC) using a client (e.g. a web browser) on a remote computer (e.g., a machine remote from the IC being evaluated but local to the engineer) to activate a test set-up that is maintained at a location that is far away from the engineer.

20 Claims, 8 Drawing Sheets

REMOTE EVALUATION TOOL

CROSS-REFERENCE TO RELATED PATENT APPLICATIONS

This patent application claims priority to and/or receive benefit from U.S. Provisional Patent Application No. 62/077,539, titled "REMOTE EVALUATION TOOL" and filed on Nov. 10, 2014. The Provisional patent application is hereby incorporated by reference in its entirety.

TECHNICAL FIELD OF THE DISCLOSURE

The present invention relates to the field of integrated circuits, in particular to methods and systems for remotely evaluating integrated circuits.

BACKGROUND

Integrated circuits processes electrical signals to produce rich electronic applications. Engineers are often tasked to evaluate integrated circuit (IC) or chips, e.g., to determine whether the chip is suitable for their desired applications. This evaluation process is time consuming.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Shortcomings of Conventional Evaluation Process

Testing the chips often require the engineer to physically acquire the integrated circuit (IC) or chip, an evaluation board on which the chip is mounted, and software that is to be used with the evaluation board. It is not uncommon for engineers to gain experience with a new IC by reading the datasheet, ordering an evaluation board, installing evaluation software and constructing a dedicated test set-up. If the chip accepts input signals, the engineers may also have to physically acquire signal generators to generate the test input signals. Many steps are involved with the evaluation process, and can often pose as a barrier to engineers evaluating the chip.

Commonly, the evaluation board is usually a printed circuit board containing the IC of interest, and the minimal support logic needed for an engineer to become acquainted with the IC on the board and to learn to program it. Evaluation boards also allow users to prototype applications in products. Unlike a general-purpose system such as a home computer, usually an evaluation board contains little or no hardware dedicated to a user interface. Usually, it has an input interface for receiving one or more inputs (e.g., signals generated by signal generators), and an output interface for outputting one or more outputs (e.g., for providing output data or signals to a computer). In some cases, the evaluation board has memory for storing data. Some embodiments may include a mechanism to receive and/or execute a user-supplied program, such as downloading a program through a serial port to flash memory, or some form of programmable memory in a socket in earlier systems.

Overview of Exemplary Features of a Remote Evaluation Tool

Remote evaluation, e.g., web-based evaluation, lowers the evaluation barrier by allowing an engineer to gain experience with an integrated circuit (IC) using a client (e.g. a web browser) on a remote computer (e.g., a machine remote from the IC being evaluated but local to the engineer) to activate a test set-up that is maintained at a location that is far away from the engineer. The IC can be an analog-to-digital converter, a digital-to-analog converter, a transceiver, etc. Exemplary features of the remote evaluation tool can include     remote control of a real test set-up via a web browser or client;

web page allows user to enter configuration parameters and test parameters;

parameter values restricted to appropriate ranges (part limitations, setup limitations, or test duration limitations);

support of multiple test types, such as single-tone, two-tone, signal transfer function, swept spurious and amplitude sweep;

web page or user interface displays test results and allows user to download results either as data or as a picture/image;

test setup comprised of signal sources/generators and an evaluation board interfaced to a personal computer or computing device;

a login page which allows the server computer to associate tests with specific users;

use of cookies so that a user need only log in once;

a file which records the tests that were run, including user information, time and parameter values;

a test queue which allows multiple users to queue requests;

a countdown timer indicating how long a user is expected to wait for a test to complete, said timer including the duration of other tests in the queue;

overload message displayed when the queue length (number of tests or time to complete) is excessive;

web page or user interface includes links to documentation and product information;

arbitration system to route user requests to one of several set-ups;

support for multiple evaluation boards connectable to signal generator(s);

dynamic limits (e.g., when the server is busy, lower the allowable test time; allow longer tests if the server is not busy);

watchdog or monitoring system to ensure the evaluation system is running properly;

real-time mode where test results are displayed continuously, and support for test scripting (e.g., user writes code or selects code snippets which are executed on the remote set-up).

As used herein, a test or test job is a task which is to be completed by the remote evaluation tool according to one or more parameters. The parameters can specify characteristics of input signals, configurations of the evaluation board and/or the IC, and/or characteristics of the test job itself.

System Overview

Figure 1:
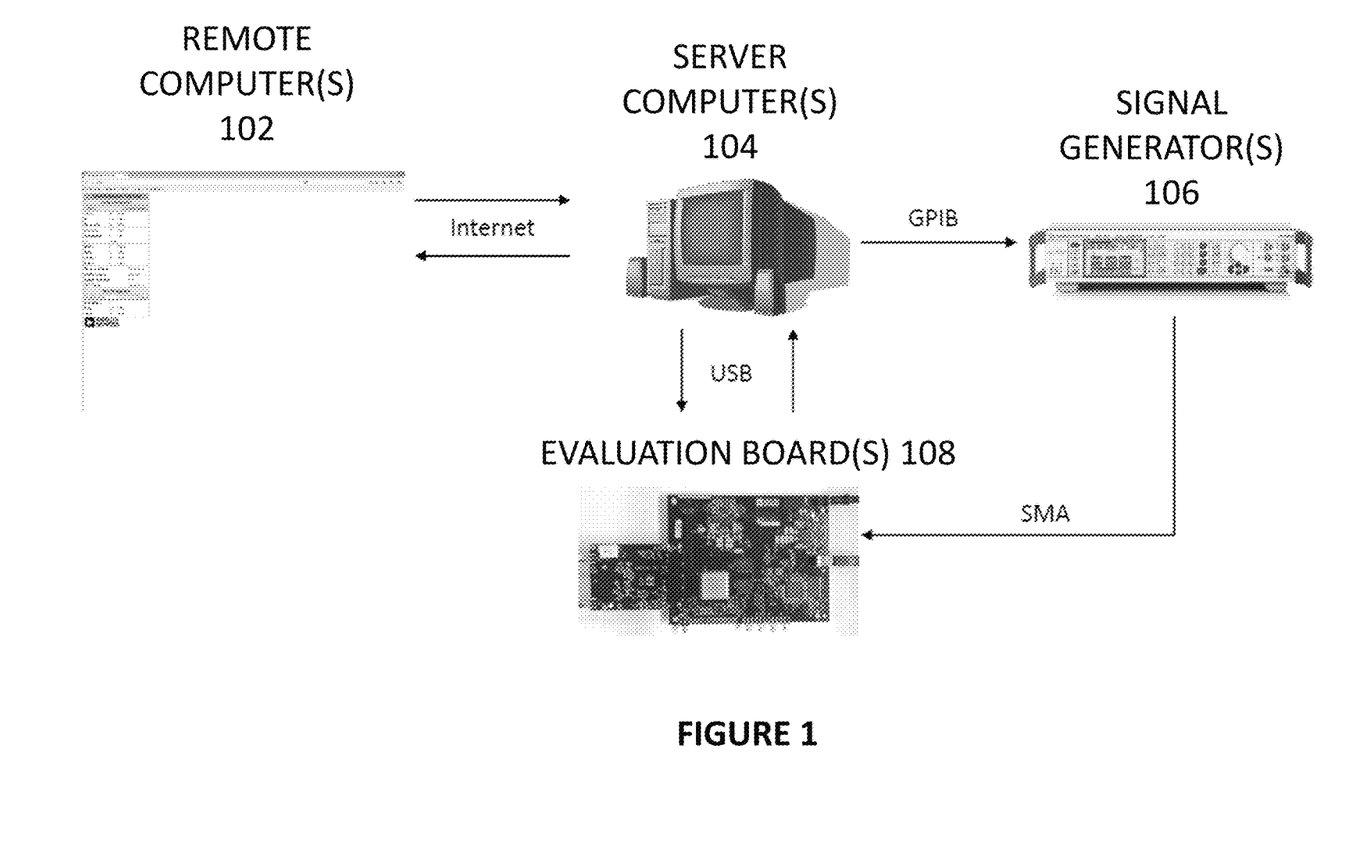
FIG. 1 is an illustrative system diagram of an exemplary remote evaluation tool, according to some embodiments of the disclosure.

FIG. 1 is an illustrative system diagram of an exemplary remote evaluation tool, according to some embodiments of the disclosure. The system includes remote computer(s) 102 (each having a client implemented thereon or a terminal for accessing a client), server computer(s) 104, signal generator(s) 106, and evaluation board(s) 108. In some embodiments, the remote evaluation tool operates as a server-client system. Server computer(s) 104 can act as a server which controls the test setup to run one or more test jobs, to which remote computer(s) can be connected as client(s) for submitting the one or more test jobs and receiving results from the one or more tests jobs. The remote computer(s) 102 can include any suitable computing device, such as a personal computer, laptop, smartphone, tablet, etc. Server computer(s) 104 can include any suitable computing device as well, e.g., server computers which have computing resources to control the test setup to run one or more test jobs and process the results from the one or more test jobs. The remote computer(s), being in a location that is remote from the server computer(s) 104, signal generator(s) 106, and evaluation board(s) 108, is preferably connected to the server computer(s) 104 via a (communication) network such as the Internet.

The test setup as described herein includes the server computer(s) 104, signal generator(s) 106, and evaluation board(s) 108. These parts of the test setup are generally located near each other (but far away from the remote computer(s) 102, and are interconnected with each other using one or more suitable wired and/or wireless interfaces.

In the example shown, the server computer(s) 104 has an evaluation board controller (e.g., specialized hardware and/or software for controlling evaluation board(s) 108), which can communicate with evaluation board(s) 108 over a Universal Serial Bus (USB), but other suitable communication bus or interface can be used. Furthermore, the server computer(s) 104 has a signal generator controller (e.g., specialized hardware and/or software for controlling signal generator(s) 106), which can communicate with signal generator(s) 106 over General Purpose Interface Bus (GPIB), but other suitable communication bus or interface can be used.

To provide one or more input signals for the evaluation board (e.g., for evaluation ICs which take one or more input signals), the signal generator(s) 106 can be connected to evaluation board(s) 108 to transmit one or more signals for running test jobs on the evaluation board over one or more SubMiniature version A (SMA) cables, but other suitable cables can be used to carry signals generated by signal generator(s) 106 to the evaluation board(s) 108. An interconnect fabric (not shown) can be used to connect outputs of signal generator(s) to one or more inputs of the evaluation board(s) 108. The interconnect fabric can be configurable by the server computer(s) 104 to connect the proper outputs of the signal generator(s) 106 to the proper inputs of the evaluation board(s) 108.

Process Overview

Figure 2:
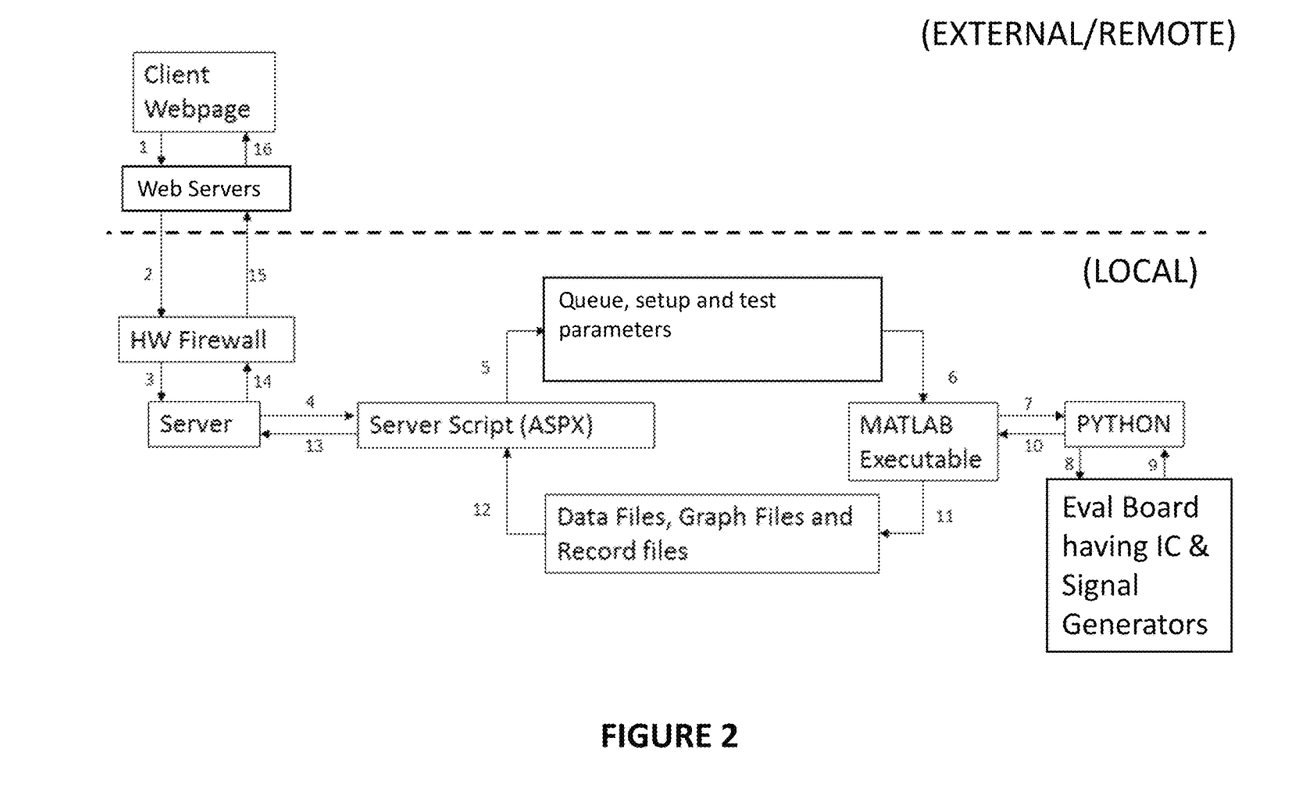
FIG. 2 is an illustrative modular diagram illustrating the process flow for providing the remote evaluation tool, according to some embodiments of the disclosure.

FIG. 2 is an illustrative modular diagram illustrating the process flow for providing the remote evaluation tool, according to some embodiments of the disclosure. Different parts of the process are indicated by numbered arrows.

In this example, the client is a web browser displaying a client webpage. The client webpage is specially designed to provide a user interface for receiving suitable data (e.g., parameters, code snippets, files, etc.) for a test job to be completed by the remote evaluation tool, and rendering an output to the user of the results of the test job. Examples of the user interface are shown in FIGS. 3-7. It is envisioned that other client interfaces can be provided (e.g., a specialized client software program instead of a web browser, or a terminal which allows a user at the remote computer to access a client software program running on the web servers).

Illustrated by arrow 1, one or more parameters received via the client webpage is received and processed by web servers. Optionally, the client webpage or the web servers can perform a validation check on the parameters received for the test job to ensure they are within valid ranges of values, or passes one or more checks. In some cases, the client webpage receives code snippets or one or more files for the test job instead of or in addition to the parameters. Optionally, the client webpage or the web servers can perform a validation check on the code snippets or one or more files received for the test job to ensure they are valid, or passes one or more checks.

Illustrated by arrow 2, the web servers provide the received data to a hardware firewall, which may provide a filter to reject any undesirable data from reaching the server.

Illustrated by arrow 3, the (filtered) data is provided to the server.

Illustrated by arrow 4, the server passes the data to a process defined by a server script (e.g., a server script). If desired, the server script can perform a validation check on the data received for the test job to ensure they are valid, or passes one or more checks.

Illustrated by arrow 5, the server script can also process the data to generate data suitable for use by an evaluation board controller and/or signal generator controller on the server (e.g., the data can include setup parameters and test parameters). The processing may include translating the data into a suitable format, and/or creating/writing one or more suitable files. The server script can also submit a test job to the queue. If applicable (not shown), the server script can determine an expected time of completion for the test job based on the queue and/or the test job(s) currently in the queue (e.g., expected time of completion=number of test job(s) in the queuex expected time per test job, or expected time of completion=sum of expected time for each test job in the queue). The expected time of completion and/or any state information of the queue can be provided back to the user via the client webpage.

Once a particular test job is in the queue, an evaluation board controller and a signal generator controller can proceed to accept and carry out the particular test job.

Illustrated by arrow 6, the setup parameters and test parameters can be provided as input to a MATLAB executable (or some other suitable numeric/mathematics computing program) to configure the executable to properly receive results of the test job.

Illustrated by arrow 7, the setup parameters and test parameters can be provided to a PYTHON script (or some other suitable script in another language) of the evaluation board controller and a signal generator controller.

Illustrated by arrow 8, suitable commands are passed on to the evaluation board having the IC and/or signal generators to carry out the test job.

Illustrated by arrow 9, results of the test job can be passed back to the PYTHON script from the evaluation board having the IC and/or signal generators to carry out the test job.

Illustrated by arrow 10, results of the test job can be passed to the MATLAB executable for processing.

Illustrated by arrow 11, the MATLAB executable can process the results of the text job to generate one or more of the following: data files, graph files, image files, and record files (or results stored in any suitable data structure or format).

Illustrated by arrow 12, the file(s) can be passed back to the server script to compile a webpage (e.g., a file) which makes the results displayable and/or accessible.

Illustrated by arrow 13, the webpage can be passed to a server.

Illustrated by arrow 14, the webpage can be passed to a hardware firewall which may filter out information which is not to be transmitted to the web servers.

Illustrated by arrow 15, the webpage can be passed to webservers.

Illustrated by arrow 16, the webpage can be rendered by display as a client webpage.

Parameters for Test Job

Exemplary parameters may include setup parameters (e.g., configuration of the IC, and/or evaluation board) and test parameters (e.g., characteristics of the input(s) as being generated by the signal generator(s) and/or output(s) generated by the evaluation board). The following outlines possible parameters and their definitions for an exemplary data converter, in this case an analog-to-digital converter (ADC):

$F_{ADC}$: The sampling frequency of the ADC.
IF: The IF (intermediate frequency) to which the ADC is tuned.
Bandwidth: The bandwidth of the ADC.
Full-Scale: The full-scale range of the ADC.
Attenuation: The attenuation. of the on-chip attenuator.
Decimation Factor: The ratio of the ADC sample rate to the output sample rate.

It is understood by one skilled in the art that if a different kind of IC is being evaluated, these parameters would vary.

User Interface Examples

Generally speaking, the user can prescribe a set of setup parameters to configure the evaluation board and/or the IC. Depending on the type of test job, users can prescribe a respective set of test parameter(s) to configure the particular type test job, and inputs/outputs to the evaluation board. The types of test jobs for an exemplary ADC can include: single tone test job, two tone test, signal transfer function, amplitude sweep, swept spurious, etc. The various setup and test parameters can be received through a form in the user interface, e.g., a web form. The user can execute the test job by clicking or selecting "run". The user interface (e.g., below the form) can include one or more user interface elements which provide the user access to the product page ("PRODUCT PAGE") and an information guide for the remote evaluation tool ("GUIDE"). The user interface (e.g., below the plot) can include one or more user interface elements which provide the user with the option to download or obtain data or files associated with the results (e.g., "TIME DOMAIN DATA", "FREQUENCY DOMAIN DATA, "SAVE DATA", "SAVE PICTURE"). Any interactions (e.g., clicks, inputs, outputs, timestamps) with the user interface can be logged as usage statistics.

Figure 3:
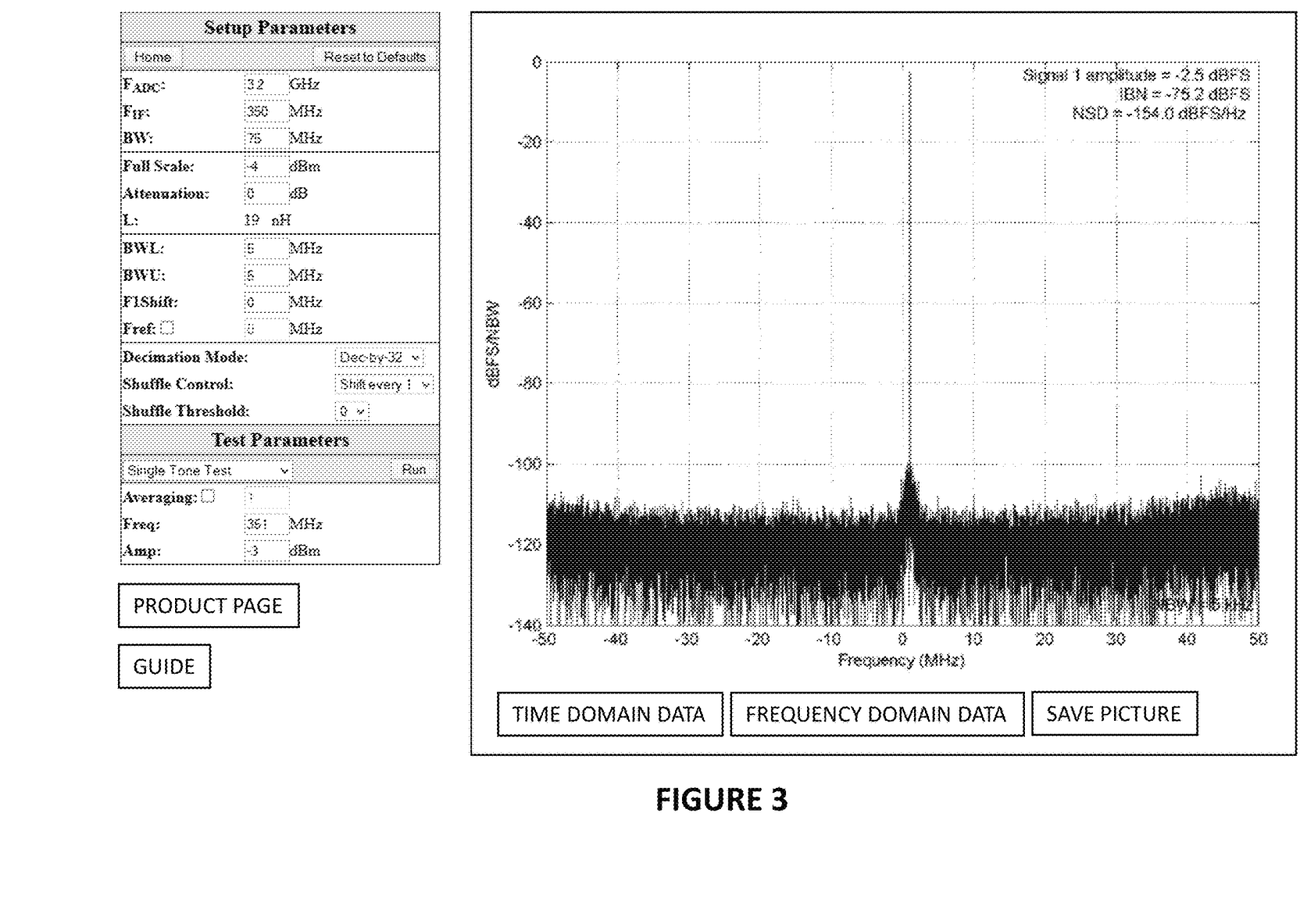
FIG. 3 is an illustrative user interface adapted to receive parameters to the remote evaluation tool and provide an output of the test results based on the parameters, according to some embodiments of the disclosure.

FIG. 3 is an illustrative user interface adapted to receive parameters to the remote evaluation tool and provide an output of the test results based on the parameters, according to some embodiments of the disclosure. This example shows a set of exemplary parameters for running a single tone test as the test job for an exemplary ADC. On the right shows the results of the test job (plot of the output signal/output data) based on the parameters shown on the left for the exemplary data converter.

Figure 4:
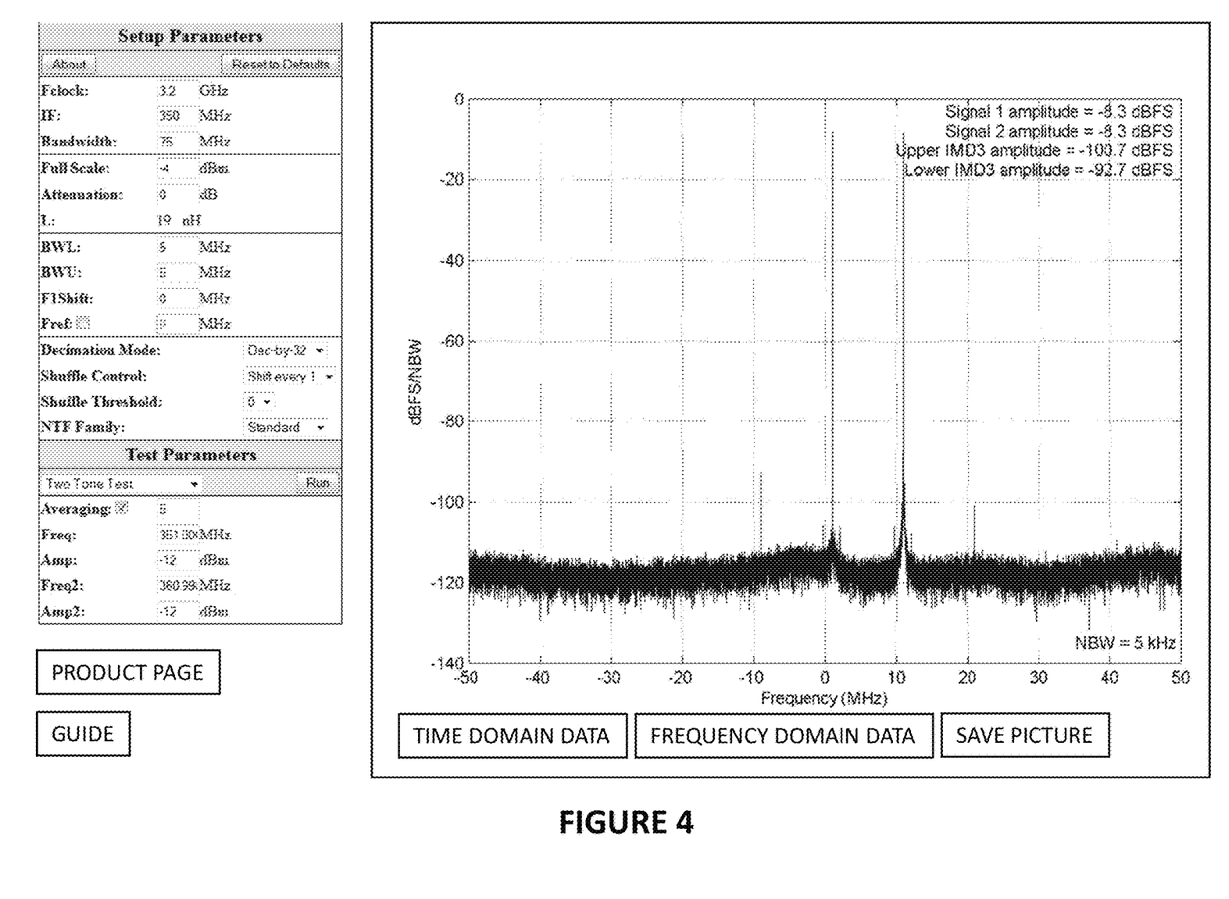
FIG. 4 is another illustrative user interface adapted to receive parameters to the remote evaluation tool and provide an output of the test results based on the parameters, according to some embodiments of the disclosure.

FIG. 4 is another illustrative user interface adapted to receive parameters to the remote evaluation tool and provide an output of the test results based on the parameters, according to some embodiments of the disclosure. This example shows a set of exemplary parameters for running a two-tone test as the test job for an exemplary ADC. On the right shows the results of the test job (plot of the output signal/output data) based on the parameters shown on the left for the exemplary data converter.

Figure 5:
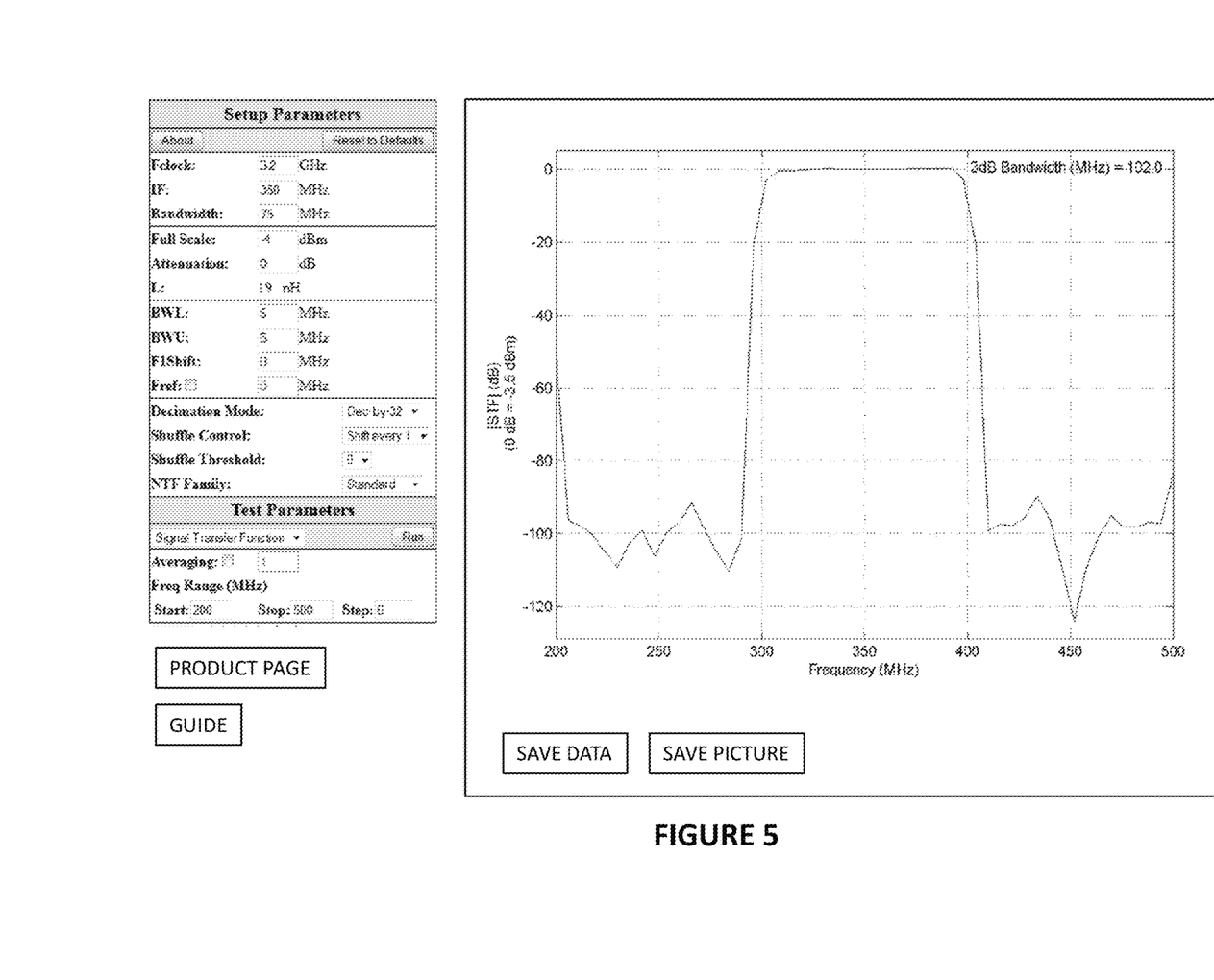
FIG. 5 is yet another illustrative user interface adapted to receive parameters to the remote evaluation tool and provide an output of the test results based on the parameters, according to some embodiments of the disclosure.

FIG. 5 is yet another illustrative user interface adapted to receive parameters to the remote evaluation tool and provide an output of the test results based on the parameters, according to some embodiments of the disclosure. This example shows a set of exemplary parameters for running a signal transfer function test as the test job for an exemplary ADC. On the right shows the results of the test job (plot of the signal transfer function (frequency versus signal transfer function) based on the parameters shown on the left for the exemplary data converter.

Figure 6:
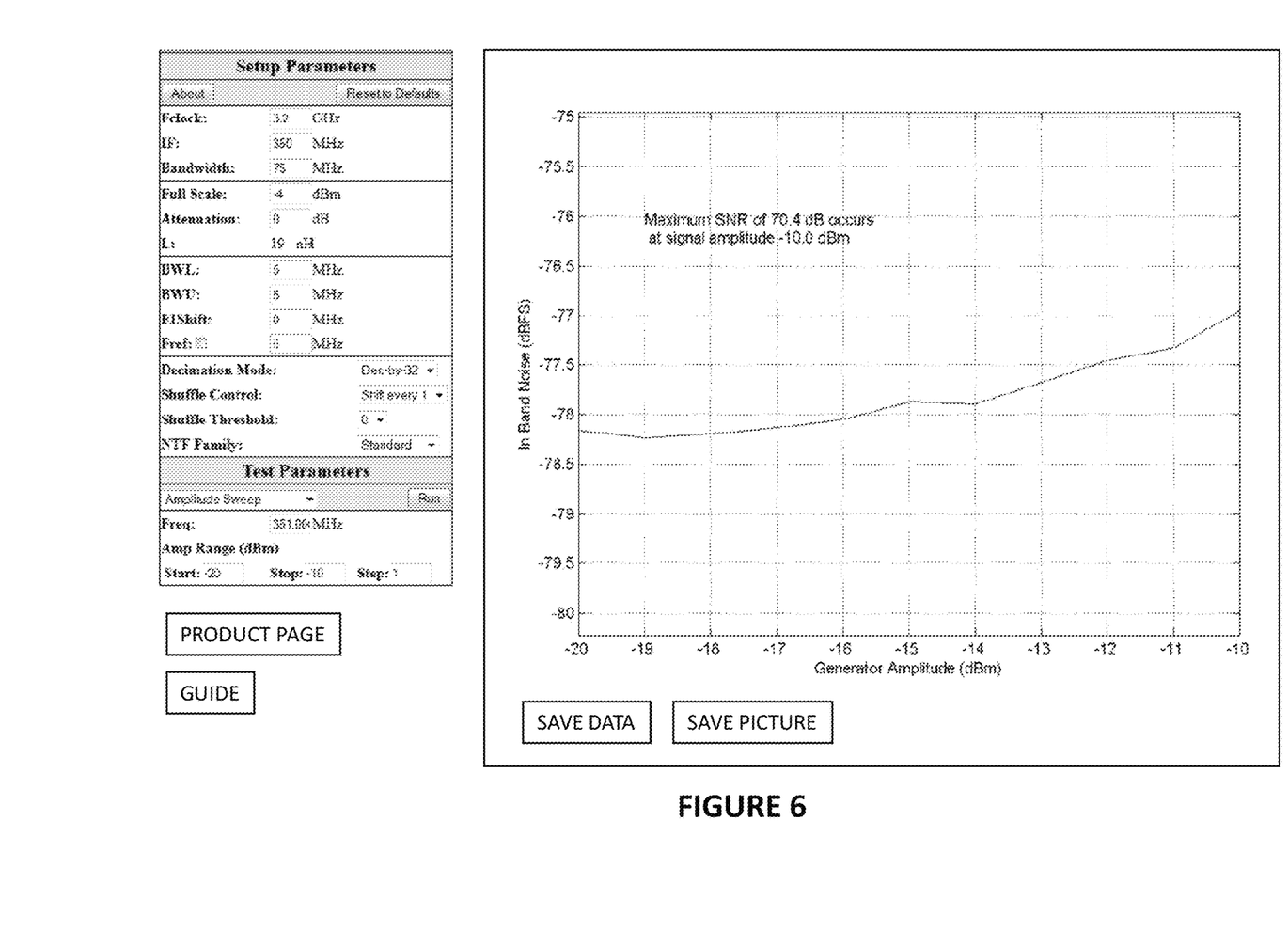
FIG. 6 is a further illustrative user interface adapted to receive parameters to the remote evaluation tool and provide an output of the test results based on the parameters, according to some embodiments of the disclosure.

FIG. 6 is a further illustrative user interface adapted to receive parameters to the remote evaluation tool and provide an output of the test results based on the parameters, according to some embodiments of the disclosure. This example shows a set of exemplary parameters for running an amplitude sweep test as the test job for an exemplary ADC. On the right shows the results of the test job (plot of the amplitude versus in band noise) based on the parameters shown on the left for the exemplary data converter.

Figure 7:
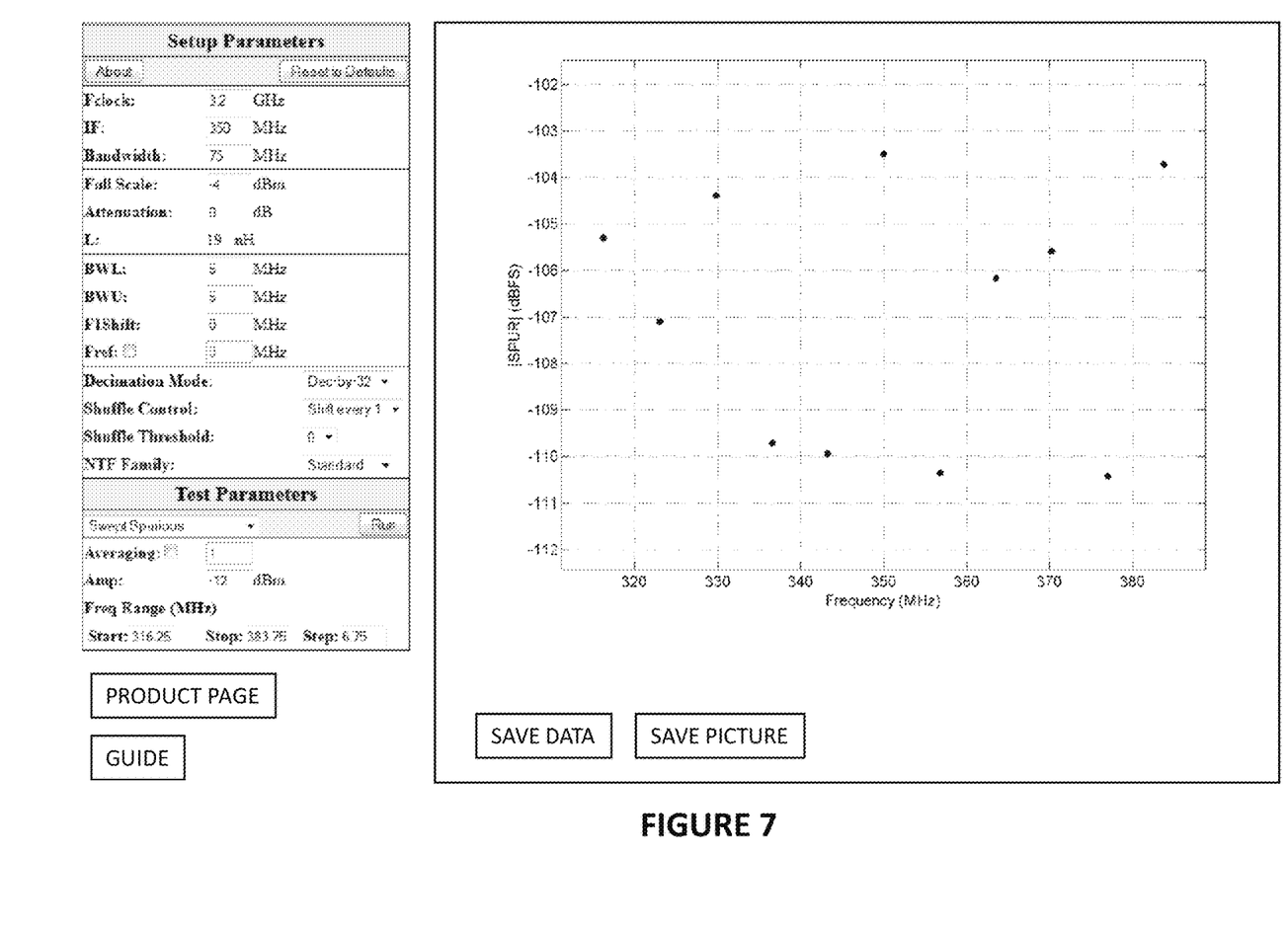
FIG. 7 is yet another illustrative user interface adapted to receive parameters to the remote evaluation tool and provide an output of the test results based on the parameters, according to some embodiments of the disclosure.

FIG. 7 is yet another illustrative user interface adapted to receive parameters to the remote evaluation tool and provide an output of the test results based on the parameters, according to some embodiments of the disclosure. This example shows a set of exemplary parameters for running a swept-spurious test as the test job for an exemplary ADC. On the right shows the results of the test job (plot of the frequency versus the spurs) based on the parameters shown on the left for the exemplary data converter.

Figure 8:
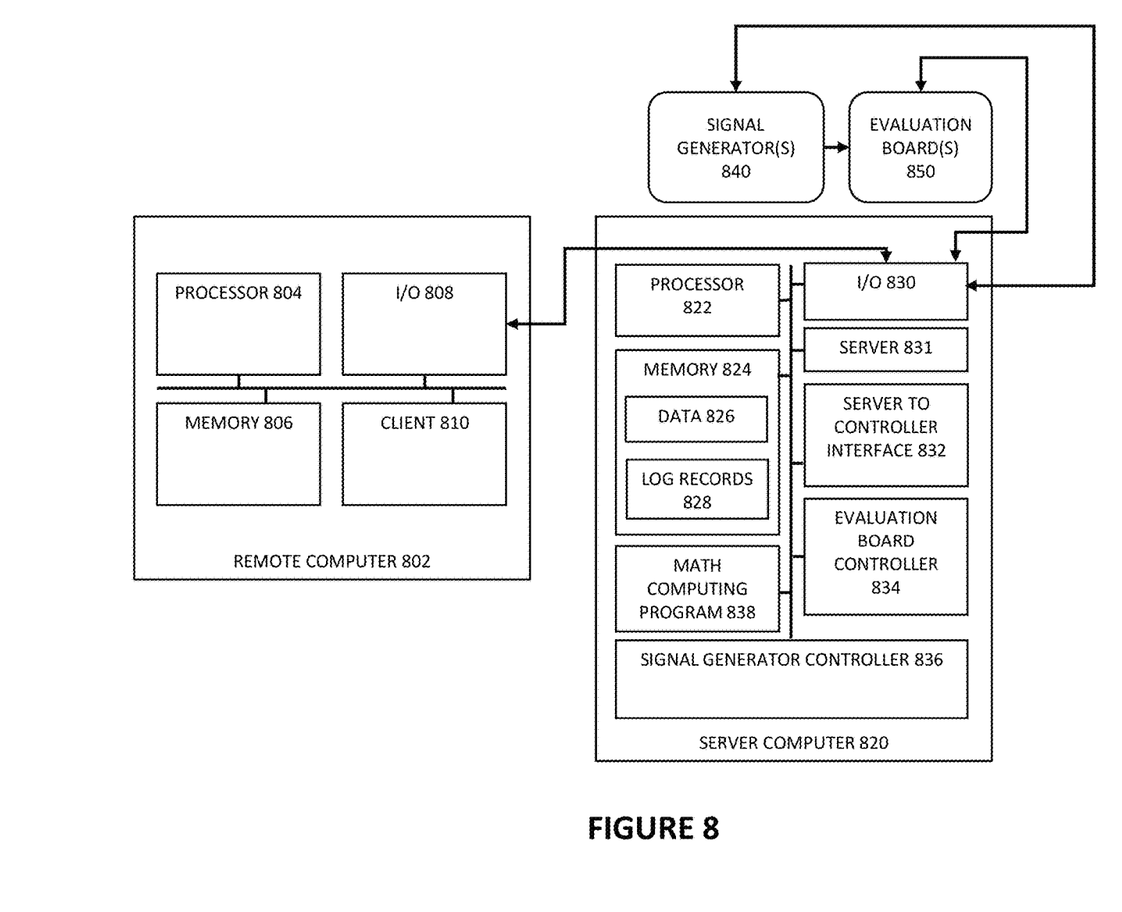
FIG. 8 shows a system diagram illustrating an exemplary remote computer and an exemplary server computer, according to some embodiments of the disclosure.

Exemplary System Level Interactions Between the Remote Computer and Server Computer FIG. 8 shows a system diagram illustrating an exemplary remote computer and an exemplary server computer, according to some embodiments of the disclosure. The overall system includes remote computer 802, server computer 820, signal generator(s) 840, and evaluation board(s) 850 (not too different from the system shown in FIG. 1). Remote computer 802 for use with the remote evaluation tool includes processor 804, memory 806, input/output interfaces (I/O) 808, and client 810, which can be interconnected via one or more communication buses. Server computer 820 can include processor 822, memory 824, I/O 830, server 831, (optional) server to controller interface 832, evaluation board controller 834, signal generator controller 836, and (optional) math computing program 838 which can be interconnected via one or more communication buses. One or more of these components can be combined as part of an evaluation board software package stored on memory 824 and/or executable using processor 822.

In general, I/O 808 and I/O 830 serve as communication interfaces, e.g., between remote computer 802 and server computer 820, between server computer 830 and signal generator(s) 840, and between server computer 830 and evaluation board(s) 850. I/O 808 and I/O 830 can also provide connectivity to a display, input/output devices that can render a user interface to facilitate human-to-machine interaction.

Client 810 can be provided by executing instructions stored on memory 806, to provide any client-related functions described herein (e.g., receiving parameters for test jobs and providing test results to the user, providing a user interface, etc.). Server 831 can be provided by executing instructions stored on memory 824, to provide any server-related functions described herein (e.g., receive and queue test jobs, validate test jobs, trigger execution of test jobs, etc.) Server to controller interface 832 provides a translation function which can translate data gathered by client 810 and received at server 831 into a format that can be used by evaluation board controller 834 and/or signal generator controller 836, which are configured to control evaluation board 850 and signal generators 840 respectively. Math computing program 838 (e.g., MATLAB) can provide a function for generating plots or math processing functions for processing output data (e.g., results of the test job) generated by evaluation board 850.

The memory 824 of server computer 820 can store data associated with results of the test job. Furthermore, memory 824 can store a log of records which can maintain information provided by the user on the client 810 (e.g., including user information, intended target application, setup parameters, test parameters) and data of the results of test jobs.

Handling Failures and Errors

In some embodiments, failures are prevented at the client and/or the server to ensure that parameters are valid. However, even when the parameters are valid, failures can occur in any of the components shown in FIGS. 1 and 8. For this reason, the overall system can include one or more failure handling mechanisms.

In some embodiments, a timeout function can be provided at the client and/or the server to throw an error if a test job fails to complete within a prescribed time period.

In some embodiments, evaluation board controller and/or signal generator controller can detect and generate errors if the evaluation board(s) and/or signal generator(s) experiences a failure.

In some embodiments, a queue-is-full function can be implemented at the server to indicate to a client that the queue is full, and/or the number of tasks is over a particular limit (or expected time to complete the tasks in the queue). The client can display a message to the user requesting the user to return at a later time (instead of allowing a new test job to be queued). The function can prevent the remote evaluation tool from being overloaded with test jobs.

In some embodiments, if the queue is full or almost full, the server may turn on and use a further evaluation board to allow the task job to be run on the further evaluation board.

In some embodiments, duplicate/redundant evaluation boards can be provided, so that if one evaluation board fails, experiences a time out, or the queue is full, etc., the queue of test jobs or new test jobs processed by a duplicate/redundant evaluation board.

In some embodiments, duplicate/redundant evaluation boards can be provided with respective queues. The respective queues for duplicate/redundant evaluation boards can be used to load balance test jobs being sent queued for these evaluation boards. For instance, the server can check the respective queues and decide which evaluation board should receive a test job. The server can add a test job to a queue which is the least full. The server can add test jobs to different queues in a random fashion. The server can add test jobs to different queues in a round robin fashion.

In some embodiments, the server can be provided with a log for maintaining a log of operations, failures, and/or errors to facilitate error diagnosis.

In some embodiments, the server can include a log for logging usage statistics, such as number of test jobs run over a given period of time (e.g., number of test jobs run each week), notification of test failure, notification of system down, etc.

In some embodiments, the server can be implemented with a function to notify an administrator of the remote evaluation tool if an error has occurred.

In some embodiments, the server can check the results of a test job to determine whether the results meet one or more criteria for validity, prior to providing the results to the user. If the results of the test job does not meet the one or more criteria, or seems abnormal, a message indicating the test job did not complete successfully can be provided to the user. The user may decide to run the test job again but with different parameters. Such failure and results can be logged for further analysis by an administrator.

Integration with Existing Evaluation Software

It is possible that the evaluation board already has existing evaluation software or tool in place, which can be used by an engineer to evaluate the IC locally with the IC in his or her possession. The present disclosed embodiments of the remote evaluation tool can readily integrate with and reuse the existing evaluation software by generating suitable data, commands, and/or files (based on the data received via the client) which can be used by the existing evaluation software without having to significantly modify the existing evaluation software. The existing evaluation software, for example, may be provided with a listening function which waits for a file to be created and executes the instructions in the file to carry out a test job. The existing evaluation software can then interface with a math computing program 838 of FIG. 8 to compile results of the test job, if applicable. The output of the math computing program, e.g., plots and/or data files, can be then provided (by the server) back to the client for user consumption.

Testing Multiple Evaluation Boards

A comprehensive remote evaluation tool can be implemented to provide a user remote access to a plurality of evaluation boards. A configurable interconnect fabric may be used to configure the proper connections among the server, signal generator(s), and chosen evaluation board(s). The comprehensive remote evaluation tool may even provide an interconnect fabric to interconnect evaluation board(s) to allow a test job to be run with chosen evaluation boards forming a signal chain.

The interconnect fabric can also be used to interconnect signal generator(s) 106 and inputs and/or outputs of different evaluation boards 108. A signal chain can be formed using different evaluation boards. For instance, the interconnect fabric can be configured to build a transmitter system signal chain and allow remote evaluation of a transmitter system signal chain. Different parts and respective evaluation boards can be swapped in or out to compare different parts within the signal chain (e.g., it is possible to allow a user to compare parts against competitor parts).

Server computer(s) 104 can implement checks to ensure the interfaces between the signal generator(s) 106 and inputs and/or outputs of different evaluation boards 108 are allowed. Implementing the checks can prevent incorrect connections which can destroy the signal generator(s) 106 and/or the evaluation board(s) 108 or lead to erroneous evaluation results.

Personal Queuing

Besides maintaining a server queue, the client may also implement a queue to allow a user to define multiple jobs and queuing them to be submitted to the server one by one. Each of the jobs in the personal queue can be associated with an expected time of completion, and/or a countdown timer.

Intelligent Client

The client, rather than receiving all inputs for the parameters directly, can provide several sets of parameters for the user to choose from to facilitate creation of a test job. In some embodiments, the client can generate or select an appropriate set of parameters based on one or more user inputs. For instance, the client may present one or more questions to the user relating to the intended application in which the IC is to be used. The application may guide the client to generate a set of suitable parameters to facilitate the creation of a test job. The intelligence can in some cases be implemented in the server.

EXAMPLES

Example 1 is a method for remote evaluation of integrated circuits. The method comprises receiving, at a server computer, a test job submitted via a remote computer, wherein the test job is a task to be completed by a remote evaluation tool; processing, at the server computer, the test job to generate signals according to the test job to control an evaluation board having an integrated circuit thereon and one or more signal generators; processing, at the server computer, one or more output signals from the evaluation board to generate results of the test job; transmitting, from the server computer, the results of the test job to the remote computer.

In Example 2, the method of Example 1 can further comprise the test job including setup parameters and/or test parameters.

In Example 3, the method of Example 1 or 2 can further include the test job being submitted by a user via the remote computer using a user interface provided by the remote computer.

In Example 4, the method of any one of the above examples can further include the remote computer being communicably connected to the server computer over the Internet.

In Example 5, the method of any one of the above examples can further include the test job being submitted by a user through a webpage using a web browser on the remote computer.

In Example 6, the method of any one of the above examples can further include processing the one or more output signals from the evaluation board comprises reading a memory on the evaluation board for output data generated by the integrated circuit.

In Example 7, the method of any one of the above examples can further include processing the one or more output signals from the evaluation board comprises generating a plot based on the one or more output signals and providing the plot as results of the test job.

In Example 8, the method of any one of the above examples can further include the remote computer being configured to display the results of the test job to a user.

In Example 9, the method of any one of the above examples can further include the server computer comprising a queue for queuing test jobs to be completed by the evaluation board.

In Example 10, the method of Example 9 can further include determining an expected time for completion based on the queue and/or test jobs therein, and transmitting the expected time for completion to the remote computer for output to a user.

In Example 11, the method of Example 9 can further include determining an expected time for completion based on the queue and/or test jobs therein, and if the expected time exceeds a predetermined limit or threshold, transmitting a message to the remote computer that the test job cannot be added.

In Example 12, the method of any one of the above Examples can further include validating at the remote computer and/or the server computer to determine whether the test job is valid.

Further examples include systems comprising a remote computer and/or a server computer for performing any one or more of the functions described herein, an apparatus comprising means for performing any one or more of the functions described herein, and non-transitory computer readable medium having instructions stored thereon, that when executed by a processor configure the processor to perform any one or more of the functions described herein.

Variations and Implementations

Note that the activities discussed above with reference to the FIGURES are applicable to remotely evaluating any integrated circuit chips. Exemplary IC chips that can be evaluated using the disclosed remote evaluation tool include data converters, filters, amplifiers, signal generators, power amplifiers, clock generators, interfaces, isolators, sensors, processors, and any suitable ICs which processes signals.

In certain contexts, the features discussed herein can be applicable to evaluating integrated circuits for automatic test equipment, avionics and missiles, cellular base stations, chemical and environmental monitors, healthcare and medical systems, infrastructure, military and aerospace, networking and communications, radar military communications and electronic warfare, industrial process control, audio and video equipment, and/or any applications using one or more integrated circuit chips.

In the discussions of the embodiments above, electrical circuits and components such as the capacitors, clocks, DFFs, dividers, inductors, resistors, amplifiers, switches, digital core, transistors, and/or other components, can readily be replaced, substituted, or otherwise modified in order to accommodate particular circuitry and system needs. Moreover, it should be noted that the use of complementary electronic devices, hardware, software, etc. offer an equally viable option for implementing the teachings of the present disclosure.

Within the context of the disclosure, a network used herein, for connecting the remote computer to the server computer, represents a series of points, nodes, or network elements of interconnected communication paths for receiving and transmitting packets of information that propagate through a communication system. A network offers communicative interface between sources and/or hosts, and may be any local area network (LAN), wireless local area network (WLAN), metropolitan area network (MAN), Intranet, Extranet, Internet, WAN, virtual private network (VPN), or any other appropriate architecture or system that facilitates communications in a network environment depending on the network topology. A network can comprise any number of hardware or software elements coupled to (and in communication with) each other through a communications medium.

In one particular instance, the architecture of the present disclosure can be associated with a service provider deployment. In other examples, the architecture of the present disclosure would be equally applicable to other communication environments, such as an enterprise wide area network (WAN) deployment, The architecture of the present disclosure may include a configuration capable of transmission control protocol/internet protocol (TCP/IP) communications for the transmission and/or reception of packets in a network.

As used herein in this Specification, the term 'network element' is meant to encompass any of the aforementioned elements, as well as servers (physical or virtually implemented on physical hardware), machines (physical or virtually implemented on physical hardware), end user devices, routers, switches, cable boxes, gateways, bridges, loadbalancers, firewalls, inline service nodes, proxies, processors, modules, or any other suitable device, component, element, proprietary appliance, or object operable to exchange, receive, and transmit information in a network environment. These network elements may include any suitable hardware, software, components, modules, interfaces, or objects that facilitate the remote evaluation operations thereof. This may be inclusive of appropriate algorithms and communication protocols that allow for the effective exchange of data or information.

Additionally, it should be noted that with the examples provided above, interaction may be described in terms of two, three, or four network elements. However, this has been done for purposes of clarity and example only. In certain cases, it may be easier to describe one or more of the functionalities of a given set of flows by only referencing a limited number of network elements. It should be appreciated that the systems described herein are readily scalable and, further, can accommodate a large number of components, as well as more complicated/sophisticated arrangements and configurations. Accordingly, the examples provided should not limit the scope or inhibit the broad techniques of remote evaluation of ICs, as potentially applied to a myriad of other architectures. For instance, instead of a server-client architecture, the remote evaluation tool can be provided in a peer-to-peer architecture. It should also be noted that many of the previous discussions may imply a single client-server relationship. In reality, there is a multitude of servers in the delivery tier in certain implementations of the present disclosure. Moreover, the present disclosure can readily be extended to apply to intervening servers further upstream in the architecture, though this is not necessarily correlated to the 'm' clients that are passing through the 'n' servers. Any such permutations, scaling, and configurations are clearly within the broad scope of the present disclosure.

Parts of various apparatuses for providing the remote evaluation tool can include electronic circuitry to perform the functions described herein. In some cases, one or more parts of the apparatus can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer medium.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the components of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the remote evaluation tool functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claim (if any) and/or appended examples. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims (if any) and/or appended examples. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to the remote evaluation tool illustrate only some of the possible functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims (if any) and/or appended examples. Note that all optional features of the apparatus described above may also be implemented with respect to the method or process described herein and specifics in the examples may be used anywhere in one or more embodiments.

What is claimed is:

1. A method for remote evaluation of integrated circuits, the method comprising:
   receiving, at a server computer, a test job submitted via a remote computer, wherein the test job comprises parameters for a task to be completed by one or more evaluation boards;
   generating, at the server computer, data for a signal generator controller for controlling a signal generator based on the parameters, wherein the signal generator is coupled to the server computer and the evaluation board;
   generating, at the server computer, data for an evaluation board controller for controlling the one or more evaluation boards based on the parameters;
   processing, at the server computer, one or more output signals from the evaluation board to generate results of the test job; and
   transmitting, from the server computer, the results of the test job to the remote computer.

2. The method of claim 1, wherein the parameters includes one or more of: setup parameters and test parameters for the signal generator controller and the evaluation board controller.

3. The method of claim 1, further comprising:
   submitting, by the server computer, the test job to a queue for queuing test jobs to be completed by the evaluation board.

4. The method of claim 3, further comprising
   determining an expected time for completion based on one or more of: the queue and test job(s) in the queue; and
   transmitting the expected time for completion to the remote computer for output to a user.

5. The method of claim 4, wherein the expected time for completion equals to a number of test job(s) in the queue multiplied by an expected time per test job.

6. The method of claim 4, wherein the expected time for completion equals to a sum of expected time for each test job in the queue.

7. The method of claim 3, further comprising:
   determining an expected time for completion based on one or more of: the queue and test jobs in the queue; and
   if the expected time exceeds a predetermined limit or threshold, transmitting a message to the remote computer that the test job cannot be added.

8. The method of claim 1, further comprising:
   storing, in a memory of the server computer, a log of records maintaining information provided by a user via the remote computer, wherein the information comprises time, user information, intended target application, setup parameters, and test parameters.

9. The method of claim 1, further comprising:
   if the test job fails to complete within a prescribed time period, throwing an error by the server computer.

10. The method of claim 1, further comprising:
    maintaining, in a memory of the server computer, a log of operations, failures, and errors.

11. The method of claim 1, further comprising:
maintaining, in a memory of the server computer, usage statistics including a number of test jobs run over a given period of time.

12. The method of claim 1, wherein processing the one or more output signals from the evaluation board comprises reading a memory on the evaluation board for output data generated by the integrated circuit.

13. The method of claim 1, further comprises:
validating at the server computer to determine whether the test job is valid.

14. The method of claim 1, further comprising:
determining whether the test job exceeds a limit on allowable test job duration; and
dynamically changing the limit on allowable test job duration based on whether the server computer is busy.

15. The method of claim 1, further comprising:
transmitting, from the server computer to the remote computer, results of the text job for display in real time by the remote computer.

16. A server computer comprising:
one or more memory elements;
one or more processors coupled to said one or more memory elements, said one or more processors configured to:
  receiving a test job submitted via a remote computer, wherein the test job comprises parameters for a task to be completed by one or more evaluation boards;
  generating data for a signal generator controller for controlling a signal generator based on the parameters, wherein the signal generator is coupled to the server computer and the evaluation board;
  generating data for an evaluation board controller for controlling the one or more evaluation boards of the remote evaluation tool based on the parameters;
  processing one or more output signals from the evaluation board to generate results of the test job; and
  transmitting the results of the test job to the remote computer.

17. The server computer of claim 16, wherein the server computer is coupled to a configurable interconnect fabric, wherein the configurable interconnect fabric is configurable to connect the server computer, one or more signal generators, and one or more selected evaluation boards.

18. The server computer of claim 17, wherein the configurable interconnect fabric is configurable to connect selected evaluation boards to run the test job according to a signal chain formed by the connected selected evaluation boards.

19. One or more non-transitory computer readable media having instructions stored thereon, that when executed by a processor configure the processor to perform the following operations:
  receiving, by a server computer, a test job submitted via a remote computer, wherein the test job comprises setup parameters and test parameters for a task to be completed by one or more evaluation boards;
  generating, by the server computer, a file based on the test job;
  listening, by an evaluation software associated with the one or more evaluation boards, for the file to be created;
  executing, by the evaluation software, instructions in the file to carry out the test job;
  compiling results of the test job using a math computing program; and
  providing output including one or more of: the math computing program plots and data files, to the remote computer.

20. The one or more non-transitory computer readable media of claim 19, wherein the operations further comprises:
  providing the setup parameters and test parameters to an executable usable by the math computing program to configure the executable to compile the results of the test job.

* * * * *